(12) United States Patent
Inaki

(10) Patent No.: US 6,514,582 B1
(45) Date of Patent: Feb. 4, 2003

(54) QUARTZ GLASS MEMBER FOR USE IN DRY ETCHING AND DRY ETCHING SYSTEM EQUIPPED WITH THE SAME

(75) Inventor: Kyoichi Inaki, Tokorozawa (JP)

(73) Assignees: Heraeus Quarzglas GmbH & Co. KG, Hanau (DE); Shin-Etsu Quartz Products Co., Ltd., Tokyo (JP)

( * ) Notice: Subject to any disclaimer, the term of this patent is extended or adjusted under 35 U.S.C. 154(b) by 0 days.

(21) Appl. No.: 09/322,388

(22) Filed: May 28, 1999

(30) Foreign Application Priority Data

May 29, 1998 (JP) .......................................... 10-164430

(51) Int. Cl.[7] .............................................. B32B 17/00
(52) U.S. Cl. ...................... 428/34.4; 428/410; 428/426
(58) Field of Search ............................... 428/34.4, 34.6, 428/426, 428, 410

(56) References Cited

U.S. PATENT DOCUMENTS 4,528,163 A * 7/1985 Albrecht
5,609,721 A * 3/1997 Tsukune et al.

* cited by examiner

*Primary Examiner*—Deborah Jones
*Assistant Examiner*—Jennifer McNeil
(74) *Attorney, Agent, or Firm*—Milde & Hoffberg, LLP

(57) ABSTRACT

A quartz glass member for use in dry etching, wherein at least the inner surface of the member to be brought into contact with plasma is constructed of synthetic quartz glass, and a dry etching system equipped with the same member. A dry etching system equipped with the quartz glass member, which minimizes the generation of particles and which prevent a drop in electrical characteristics from occurring on the silicon wafer.

4 Claims, 1 Drawing Sheet

QUARTZ GLASS MEMBER FOR USE IN DRY ETCHING AND DRY ETCHING SYSTEM EQUIPPED WITH THE SAME

FIELD OF THE INVENTION

The present invention relates to a plasma etching system, and in further detail, it relates to a dry etching system in which the etching rate and the variation in surface roughness of quartz glass members are reduced, and in which the generation of particles during etching is minimized.

PRIOR ART

Recently, a dry etching process employing gas plasma has been used in the etching treatment of the surface of a semiconductor device such as a silicon wafer, etc. In the dry etching process, a gas is introduced into a naturally occurring quartz glass vessel and excited by a microwave to generate a plasma therein. The gas thus excited is then used in the fine patterning process by etching the oxide films and the Poly-Si films provided on the surface of a silicon wafer. In the dry etching process, though a gas containing fluorine such as $CF_4$, etc. is used, it has a disadvantage because the gas containing fluorine forms a by-product such as HF, etc. in a plasma state, and the by-product etches quartz glass to generate particles, which adhere on the surface of a semiconductor device such as a silicon wafer thereby impairing the electrical characteristics, especially the dielectric breakdown characteristics. To overcome this disadvantage, materials having excellent resistance against plasma, such as a ceramic vessel, have been developed, but those materials were found to have a higher dielectric constant as compared with quartz glass, and were thereby disadvantageous in that they had poor transmittance of microwaves. Thus, a naturally occurring quartz glass member is still used at present.

SUMMARY OF THE INVENTION

In the light of these circumstances, studies have been conducted on the fluorine plasma characteristics of quartz glass; and as a result, it has found that a synthetic quartz glass, as compared with a naturally occurring quartz glass, has excellent fluorine plasma characteristics and a low etching rate and also has a small variation in surface roughness on the surface of the quartz glass, and the generation of particles is suppressed.

Therefore, it is an object of the invention to provide a quartz glass member for use in dry etching which minimizes the generation of particles during an etching process.

A further object of the invention is to provide a dry etching system equipped with the quartz glass member for use in dry etching.

These objects and other objects of the invention which will become apparent from the following specification are provided by a quartz glass member for use in dry etching, wherein at least the inner surface of the member to be brought into contact with plasma is constructed of synthetic quartz glass.

As described above, in the quartz glass member for use in dry etching according to the invention, at least the inner surface of the member to be brought into contact with plasma is constructed of a synthetic quartz glass, and particularly, the synthetic quartz glass constituting the inner surface of the member preferably has a plasma etching rate of 40 nm/min or less and a variation in surface roughness ($R_{max}$) of 1 nm/min or less. If the plasma etching rate of the quartz glass member exceeds 40 nm/min, the particles produced by etching of quartz glass adhere to the surface of the silicon wafer to degrade the electrical characteristics thereof. If the variation in surface roughness ($R_{max}$) of the quartz glass member exceeds 1 nm/min, the surface area of the quartz glass surface in contact with the plasma greatly changes to destabilize the etching rate of the silicon wafer. When the surface of the quartz glass is roughened, the ions and radicals generated by plasma tend to react easily with the surface of the quartz glass and the amount of ions and radicals decreases in the plasma. Moreover, the by-products that are produced by etching are more likely to adhere to the surface of the quartz glass and absorb the ions and radicals. These are the cause for the instability in etching rate. On the other hand, if the surface of the quartz glass member does not undergo etching at all, the by-products that are produced by etching tend to undergo peeling off even if they adhere to the surface of the quartz glass member, and the by-products thus peeled off adhere to the surface of the silicon wafers, resulting in degradation of the characteristics of the silicon wafer. Accordingly, at least, the variation in surface roughness of the quartz glass member is required to be at least 0.001 nm/min. The etching rate of the quartz glass depends on temperature, and the etching rate in the invention is defined to be that at 100° C. For instance, an etching rate of 40 nm/min at 100° results at 300° C. to an etching rate of approximately 700 nm/min.

PREFERRED EMBODIMENTS OF THE INVENTION

Figure 1:
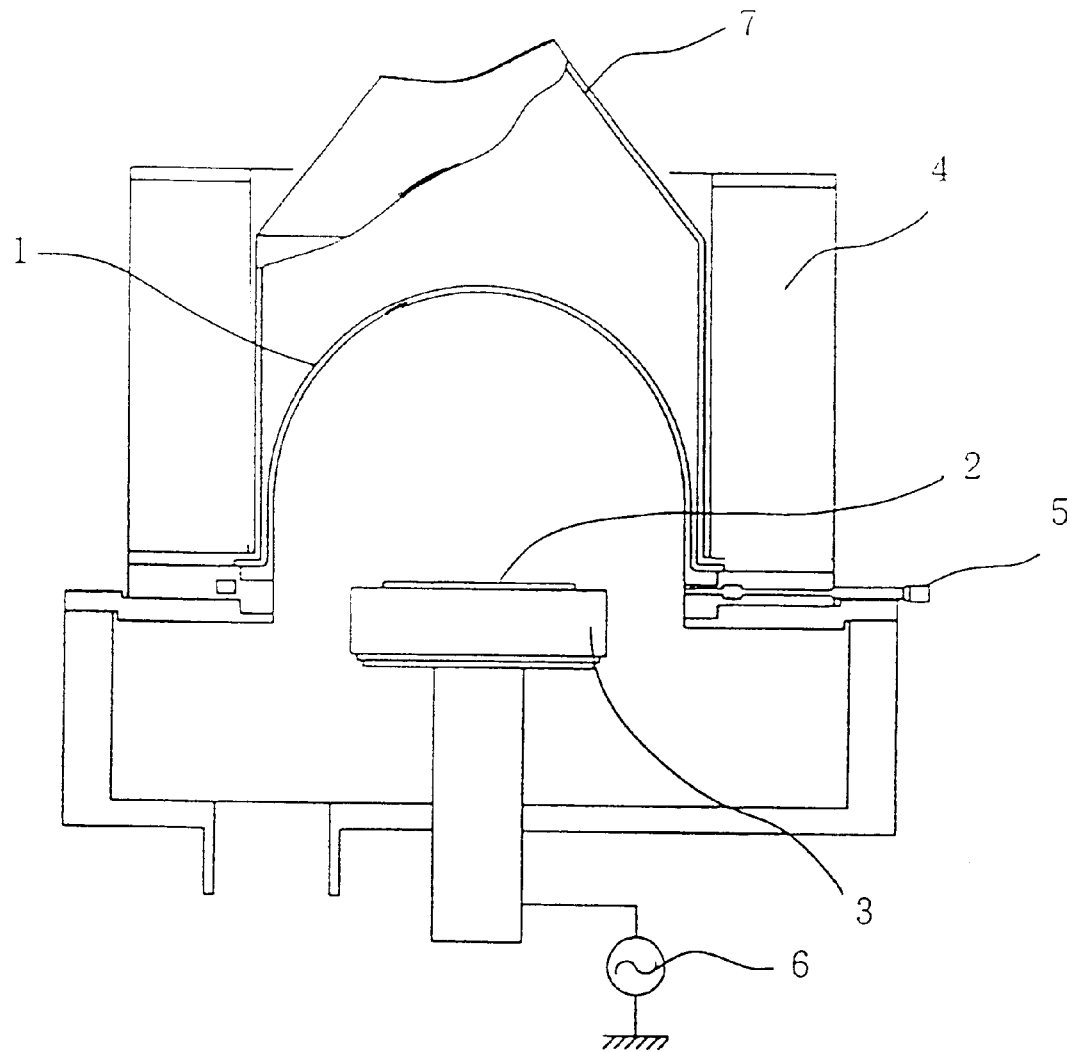
FIG. 1 illustrates a dry etching system equipped with a quartz glass member for dry etching according to the present invention.

The shape of the quartz glass member for use in dry etching according to the invention is not particularly limited, but preferably is a bell jar type or plate type. The plate type as referred to herein is a disk, a rectangular sheet, a ring, or a flange.

The quartz glass member for use in dry etching can be produced by, for instance, a production method as described below. Namely, thin sheets of a naturally occurring quartz glass and of a synthetic quartz glass are prepared, respectively, and the two sheets are superposed and set in a carbon mold frame. Then, the carbon mold frame is heated, and when the thin sheet of the quartz glass initiates thermal deformation, a load is applied from the upper side to shape the quartz glass sheet into the shape of the carbon mold. This is the method of producing a quartz glass member comprising tightly adhered thin sheets of a naturally occurring quartz glass and of a synthetic quartz glass formed into the shape of the carbon mold frame. The synthetic quartz glass must be free from incorporated bubbles. It is preferred that the content of heavy metal impurities in the synthetic quartz glass is low. It is further preferred that the synthetic quartz glass is homogeneous in composition and reduced in defects and striae (i.e., the distribution of OH group concentration). Such a synthetic quartz glass can be produced by kneading a commercially available synthetic quartz glass at high temperatures to obtain a homogeneous composition. Although there is no particular limitation concerning the sheet thickness of the synthetic quartz glass, a preferable thickness is at least 0.1 mm. It is required that the degree of homogeneity of the synthetic quartz glass, i.e., $\Delta n$, is $1 \times 10^{-3}$ or less.

An example of a dry etching system equipped with a quartz glass member for use in dry etching according to the invention is shown in FIG. 1. In FIG. 1, 1 is a quartz glass bell jar; 2 is a silicon wafer; 3 is a sample table; 4 is a solenoid coil; 5 is an etching gas inlet; 6 is a high frequency power source; and 7 is a wave guide tube. In the system of FIG. 1, the wafer 2 mounted on the sample table 3 is transported into the quartz glass bell jar, where the microwave generated by the microtron 4 is introduced into the quartz glass bell jar 1. The electric field induced by the microwave and the magnetic field generated in the direction perpendicular thereto function synergistically to produce a plasma of the gas which is introduced from the etching gas inlet 5, and thereby, induces a cyclotron movement in the electrons generated inside the plasma to produce an ionic energy that is irradiated to the wafer to etch the thin film provided on the surface of the wafer.

The Examples of the invention are described below, but it should be understood that the invention is not limited thereto.

EXAMPLE 1

A homogeneous synthetic quartz glass sheet (2 mm in thickness) having a $\Delta n$ of $1 \times 10^{-5}$ (obtained by thoroughly kneading at high temperature) and a naturally occurring quartz glass sheet (2 mm in thickness) were set in a carbon mold frame, and were heat welded to produce a quartz glass bell jar, having an inner surface which is formed by the synthetic quartz glass sheet. The quartz glass bell jar was incorporated in a dry etching system, and after supplying thereto an etching gas containing gaseous fluorine, plasma was generated by applying a high frequency wave of 2.45 Ghz to etch the silicon wafer. The number of particles on the surface of the silicon wafer after the etching treatment was monitored, but no anomaly was observed thereon. Furthermore, the etching rate and the variation in surface roughness ($R_{max}$) were measured on the quartz glass bell jar after the etching process. The etching rate was 10 nm/min, and the variation in surface roughness was 0.05 nm/min.

EXAMPLE 2

A homogeneous synthetic quartz glass sheet (2 mm in thickness) with a $\Delta n$ of $1 \times 10^{-4}$ obtained in the same manner as in Example 1 and a naturally occurring quartz glass sheet (2 mm in thickness) were heat welded to produce a quartz glass bell jar. The quartz glass bell jar was incorporated in a dry etching system, and after supplying thereto an etching gas containing gaseous fluorine, plasma was generated by applying thereto a high frequency wave of 2.45 GHz to etch the silicon wafer. The number of particles on the surface of the silicon wafer after the etching treatment was monitored, but no anomaly was observed thereon. Furthermore, the etching rate and the variation in surface roughness ($R_{max}$) were measured on the quartz glass bell jar after the etching process. The etching rate was 30 nm/min, and the variation in surface roughness was 0.5 nm/min.

Comparative Example 1

A naturally occurring quartz glass sheet (4 mm in thickness) was used to produce a quartz glass bell jar. The quartz glass bell jar was incorporated in a dry etching system, and after supplying thereto an etching gas containing gaseous fluorine, plasma was generated by applying thereto a high frequency wave of 2.45 GHz to etch the silicon wafer. The number of particles on the surface of the silicon wafer after the etching treatment was monitored, where a great number of particles was found to have been generated from the initial stage, and the number of particles increased abnormally with an increase in the time of usage. The etching rate and the variation in surface roughness ($R_{max}$) were measured on the quartz glass bell jar after the etching process. The etching rate was 100 nm/min, and the variation in surface roughness was 5 nm/min.

The quartz glass member for use in dry etching according to the invention yields not only a low plasma etching rate, but also a small variation in surface roughness, and yet generates less particles. The dry etching system equipped with the quartz glass member for use in dry etching prevents the adhesion of particles from occurring on the surface of silicon wafers, and it prevents the drop in the electrical characteristics thereof.

The foregoing specification and drawings have thus described and illustrated a novel quartz glass member for use in dry etching and a dry etching system equipped with the same. Many changes, modifications, variations and other uses and applications of the subject invention will, however, become apparent to those skilled in the art after considering this specification which discloses the preferred embodiments thereof. All such changes, modifications, variations and other uses and applications which do not depart from the spirit and scope of the invention are deemed to be covered by the invention, which is to be limited only by the claims which follow.

What is claimed is:

1. A quartz glass member for use in dry etching, characterized in that at least the inner surface of the member to be brought into contact with plasma is constructed of synthetic quartz glass, wherein the synthetic quartz glass has a plasma etching rate of 40 nm/min or lower and a variation in surface roughness ($R_{max}$) of 1 nm/min or lower, and a degree of inhomogeneity of the synthetic quartz glass of $1 \times 10^{-3}$ or less.

2. A quartz glass member for use in dry etching as claimed in claim 1, wherein the quartz glass member is a bell jar.

3. A quartz glass member for use in dry etching as claimed in claim 1, wherein the quartz glass member is a plate.

4. A dry etching system equipped with the quartz glass member for use in dry etching as claimed in claim 1.

* * * * *